United States Patent [19]

Coby et al.

[11] 4,209,741
[45] Jun. 24, 1980

[54] APPARATUS FOR THE CONTINUOUS MONITORING OF GROUND BED RESISTANCE

[75] Inventors: August D. Coby, Ripley, W. Va.; Wils L. Cooley, Morgantown, W. Va.

[73] Assignee: The United States of America as represented by the Secretary of the Interior, Washington, D.C.

[21] Appl. No.: 884,450

[22] Filed: Mar. 8, 1978

[51] Int. Cl.² ............................................. G01R 27/02
[52] U.S. Cl. ......................................... 324/62; 324/64; 324/65 R; 361/42
[58] Field of Search ......................... 324/62, 64, 65 R; 361/42

[56] References Cited
U.S. PATENT DOCUMENTS

| 1,719,786 | 7/1929 | Schlumberger | 324/64 X |
| 1,887,915 | 11/1932 | Borden | 324/62 |
| 2,122,549 | 7/1938 | Borden | 324/62 |
| 2,260,234 | 10/1941 | Rolfe | 324/62 |
| 2,375,022 | 5/1945 | Morris et al. | 324/62 |
| 3,319,158 | 5/1967 | McDoulett et al. | 324/62 X |
| 3,754,221 | 8/1973 | Stelter | 361/42 X |
| 3,913,010 | 10/1975 | Scarpino | 324/62 X |
| 3,934,176 | 1/1976 | Vasudevan et al. | 324/62 X |

Primary Examiner—Stanley T. Krawczewicz
Attorney, Agent, or Firm—Thomas Zack; Donald A. Gardiner

[57] ABSTRACT

A system for measuring the resistance of an earth electrode such as a coal mine safety ground bed. Current is circulated between the bed and an auxiliary current probe installed approximately ten times the maximum linear dimension of the ground bed under test. By measuring the voltage level between the ground bed and an auxiliary voltage probe placed about 62 percent of the distance from the ground bed to the auxiliary current electrode along the straight line between them, the true resistance of the ground bed can be determined. To sense the current value of the current flowing into the ground bed, a current transformer is placed around the lead to the ground bed. Voltage measurements are made with a high impedance voltage amplifier connected between the ground bed and the auxiliary voltage probe. Continuous monitoring of the measurements obtained without the presence of operator is achieved by using an analog divider and filter with their output terminal being connected to a recorder.

9 Claims, 7 Drawing Figures

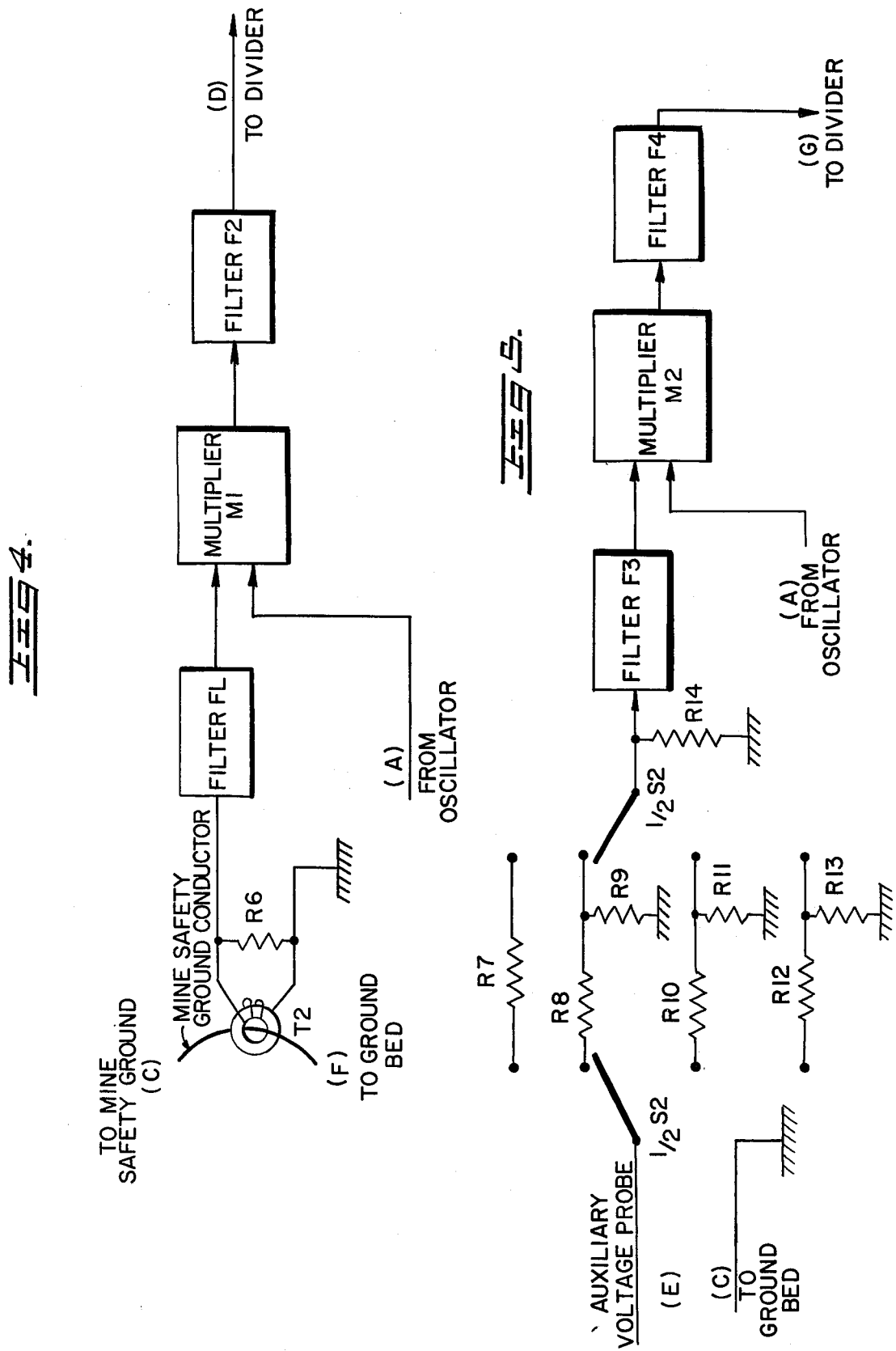

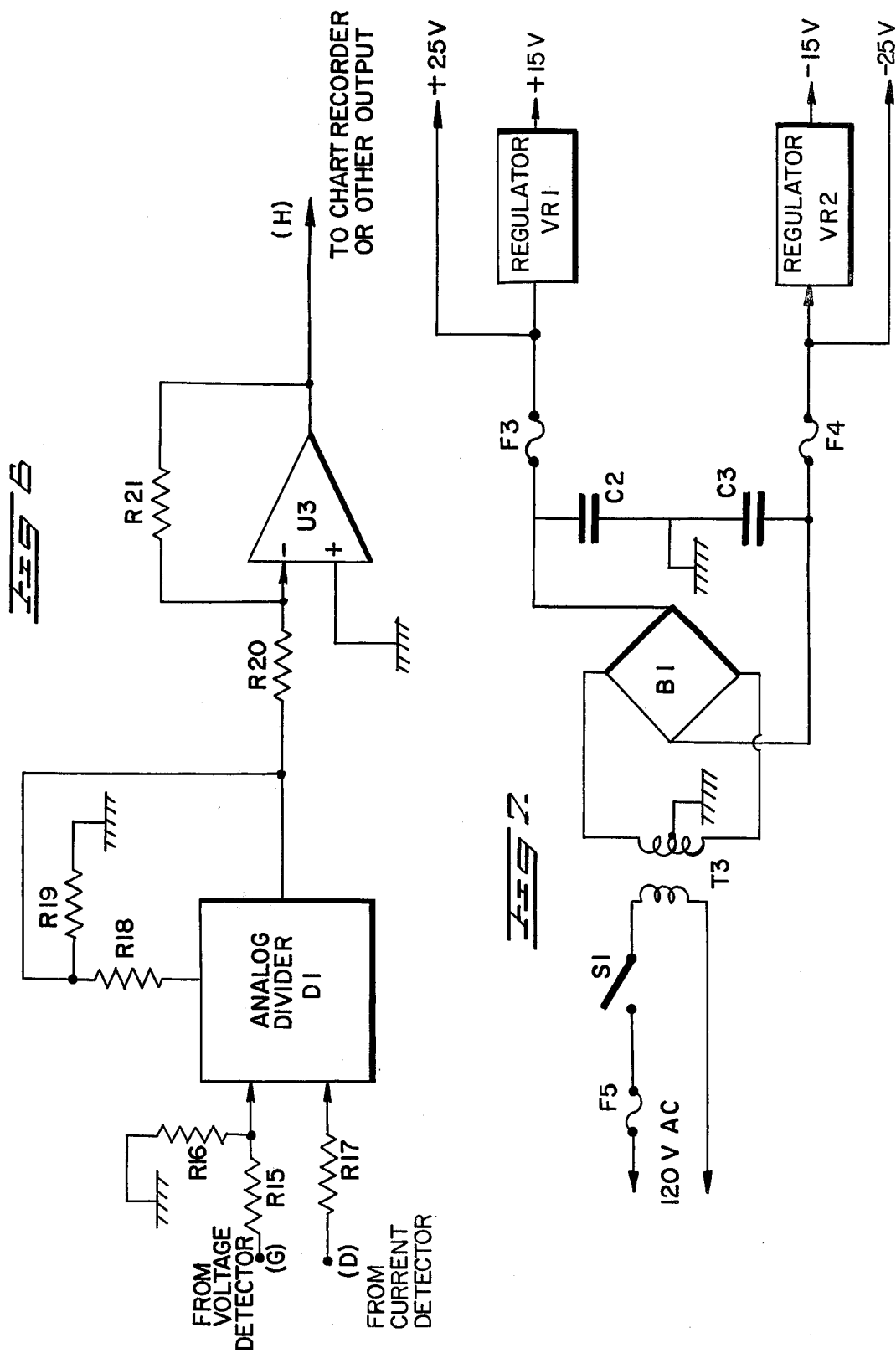

APPARATUS FOR THE CONTINUOUS MONITORING OF GROUND BED RESISTANCE

BACKGROUND OF THE INVENTION

1. Field of the Invention

The invention is a system for determining the resistance value of an earth electrode.

2. Description of the Prior Art

It is known that the true resistance of a ground bed can be measured by circulating a current between the bed and a spaced auxiliary current probe. This valve is then used in conjunction with the value obtained from an auxiliary voltage probe—placed about 62 percent of the straight line distance from the ground bed to the auxiliary current electrode—to determine the resistance by dividing the voltage by the current. We utilize this same basic principle but improve on it by incorporated several novel features.

The two known United States patents having the nearest functional similarly to our invention are the U.S. Pat. Nos. 2,260,234 (G. B. Rolfe) and 2,375,022 (G. V Morris et al). However, even these patents differ from our invention in that they cannot measure the resistance of a ground-bed on a multiply-connected (i.e. parallel) grounding system and they require continual operator activity to get the desired result. Thus, we believe that our invention is the first capable of providing continuous ground resistance records for a multiply connected system.

SUMMARY OF THE INVENTION

This system, which is used to measure the electrical resistance of an earth electrode, has a grounding conductor with the primary coil of a transformer encircling it; a spaced auxiliary voltage probe; and a spaced auxiliary current probe. A constant current a.c. signal at a fixed frequency is supplied to the auxiliary current probe. Synchronous voltage and current detectors are used to send signals to an analog divider-filter and recorder from the respective, auxiliary voltage and current probes. At the same time a lead from the transformer is connected to the synchronous current detector.

The primary object of this invention is an improved system for continuously monitoring the ground bed resistance of an earth electrode.

FIG. 1 schematically illustrates how the preferred embodiment of the invention would be set up.

FIG. 3 depicts one possible circuit arrangement for the oscillator and current source.

FIG. 4 uses block diagram format to show how the current to the safety ground bed may be sensed, sent to filters and to the synchronous detector.

FIG. 5 illustrates how the voltage sensor, scale adjustor, synchronous detector, and filters may operate.

FIG. 6 shows more details relating to the voltage divider and scale amplifier.

FIG. 7 indicate the preferred embodiment for the power supply.

Figure 1:
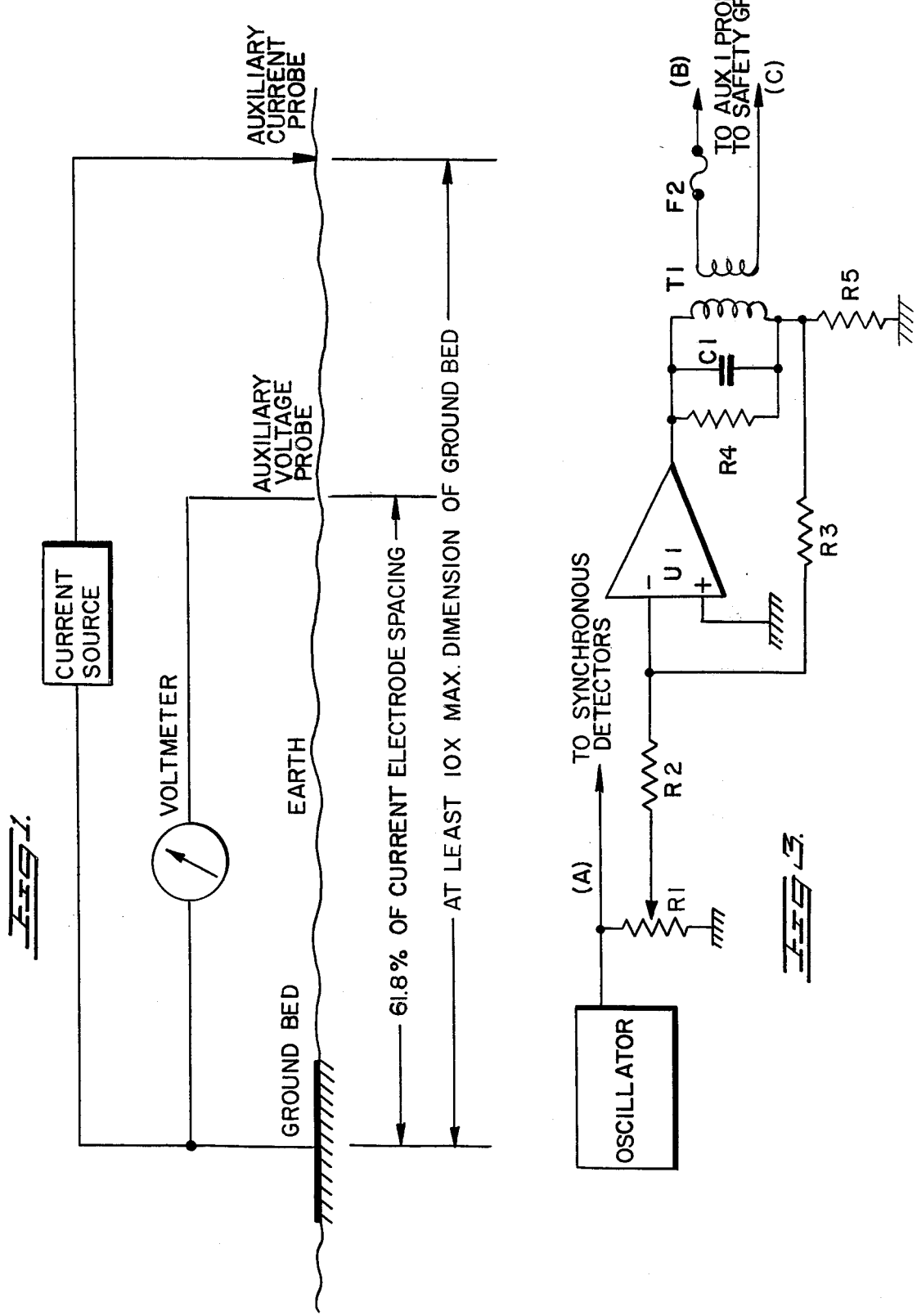

Referring first to FIG. 1 the general set-up of the preferred embodiment is schematically illustrated. This set-up is in accordance with the generally accepted theory sometimes referred to as the "fall-of potential" method in which the true resistance of the ground bed can be measured by circulating a current between the ground bed and a spaced auxiliary current probe. Preferably this current probe is spaced a straight line distance of at least ten times the maximum dimension of the ground bed under test. An auxiliary voltage probe and voltmeter are also used. This voltage probe is spaced about 61.8% of the linear distance from the ground bed to the auxiliary current probe along the straight line joining them. If the measured voltage level (a.c.) is divided by the known value of the (a.c.) current through its probe, the result is the true resistance of the ground bed. The basis for this result can be found on page 196 of the reference work of G. F. Tayg entitled "Earth Resistances" published in 1964 by the Pitman Publishing Co. of New York, N.Y.

Our invention is a modification of this basic theory which uses the set up of FIG. 1. In making our modification we have added two major novel features. The first of these is its ability to correctly measure ground bed resistance when the bed is connected to earth within a mine. Secondly, our system is capable of making continuous measurements of the bed resistance without the presence of an operator. Thus, an active system with the power "on" can have its ground bed resistance measured and constantly monitored. These particular features are very desirable in an operating mine system employing large numbers of electrically operated devices and machines since they allow ground beds to be continuously and accurately monitored and failures detected without shutting down the entire system.

Figure 2:
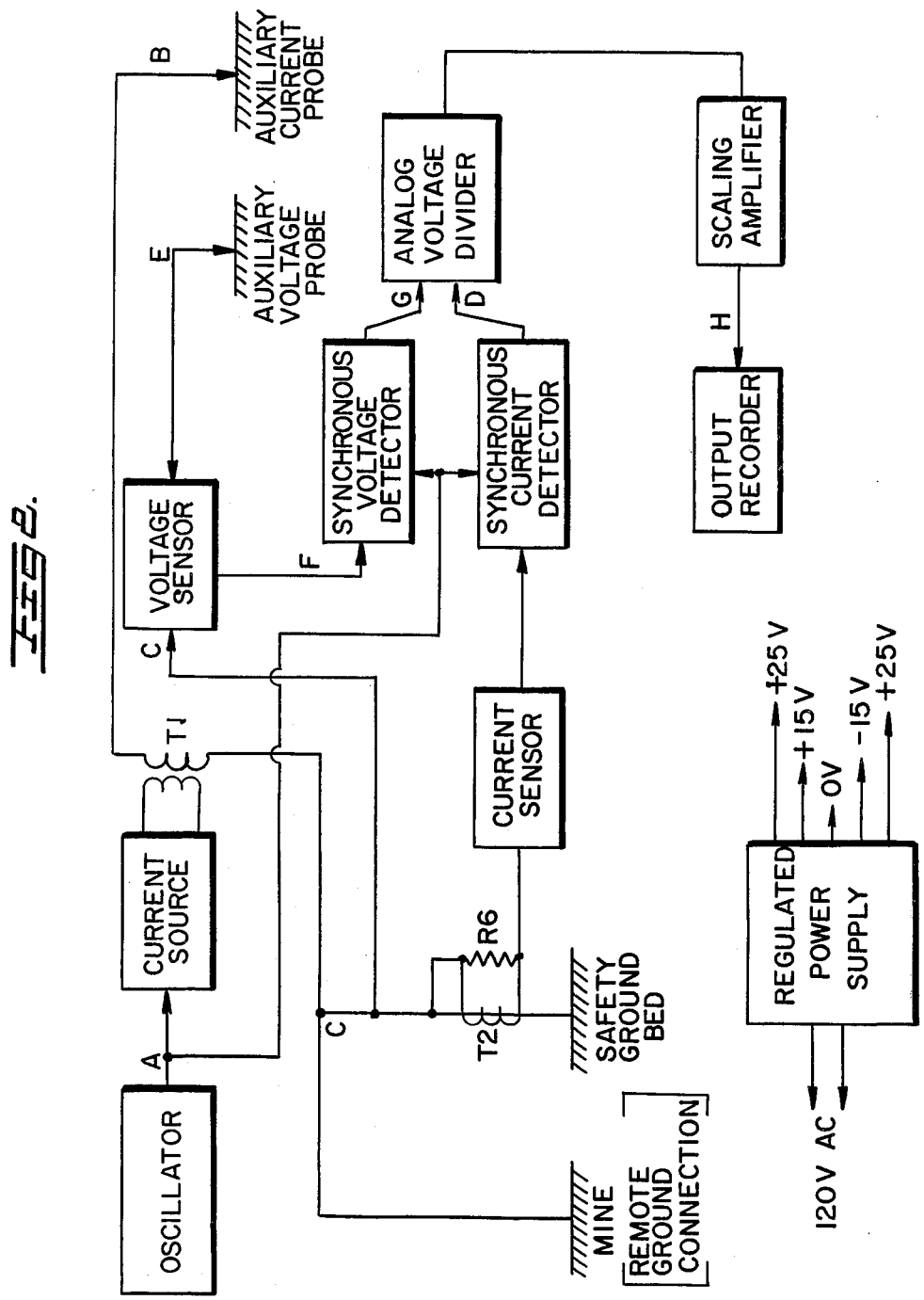
FIG. 2 is a block diagram of the major circuit components making up the preferred embodiment of this invention set up in situ in a mine.

The block diagram of FIG. 2 depicts the basic circuit components used in and with the preferred embodiment of our invention. These may be grouped into several categories namely: the power supply; the oscillator and current source; the current sensor, the voltage sensor; the synchronous current detector; the synchronous voltage detector; the analog divider; the low-pass filter, and output recorder. Of these components those absolutely necessary to the operation of the preferred embodiment are: the oscillator, the constant current source, the current and voltage sensors, the synchronous voltage and current detectors, the analog divider and low-pass filter, and a power supply. The power supply may be an internal self-contained source such as a battery to allow the unit to be portable, or it could be the external local alternating current power lines, as shown, such as those commonly found in mine power systems.

Again referring to the same figure, the objective is to measure the electrical ground resistance of the safety ground bed. To achieve this desired objective the voltage value from the voltage probe has its value, after synchronization of signals, divided by the detected current probe value with the analog divider. The oscillator is a standard circuit, for example one with a Wein Bridge circuit, used to generate a test signal A which is sent to the current source as a drive signal and a reference signal to the two synchronous detectors. In one example this signal was a low-distortion 11 hertz (Hz) output. At the current source signal A is processed, as will be explained hereinafter, to output a nearly constant current signal B which latter signal is sent to the auxiliary current probe. Around the lead or electrode to the safety ground bed is a current transformer $T_2$ which acts as a current sensor. In this way signal C is directly related to actual changes in current in the ground connection from the particular equipment, etc., under observation. Also connected to the ground connection electrode is a voltage sensor. It is located between the ground bed and the auxiliary voltage probe and serves the dual purpose of sensing the voltage level of the ground signal E, after the auxiliary current probe test signal B transverses through the earth, and sending a signal F to the synchronous voltage detector. After signals A, C, and F are received as shown, the detectors output the representative signals G and D for the detected voltage and current levels, respectively which signals are sent to the analog voltage divider. After being processed by the sealing amplifier, the output from the divider is sent as signal H to the output recorder.

FIGS. 3 to 7 represent different possible circuit arrangements for the elements described in the FIG. 2 block diagram. One possible type of FIG. 2 oscillator and current source arrangement is illustrated in FIG. 3. Starting at the left, the oscillator circuit block may be a Wein Bridge Type such as that described in the reference work by J. G. Graeme, G. E. Tobey, and L. P. Haelsman, eds. entitled "Operational Amplifiers Design and Applications", McGraw-Hill Book Co., N.Y. 1971, (hereinafter referred to as "Operational Amplifiers") on pages 383-385, FIG. 10 14. This oscillator circuit serves the dual function of supplying an adjustable drive signal A to the current source and a reference input signal to the two (voltage and current) synchronous detectors. At the current source there is an integrated transconductance amplifier $U_1$ which functionally takes an input signal of approximately 5-10 volts RMS and outputs a signal of approximately 1 ampere RMS i.e., it converts a voltage signal to a current signal. This current signal output signal is sent to the current transformer $T_1$ with its 1:2 turns ratio. Fuse $F_2$ protects this transformer against possible shorts on lead (C). Potentiometer $R_1$ with its variable resistor is used to adjust the magnitude of the current signals (B and C) initially being supplied to the ground bed through the leads (B) and (C) which bear the same designations. The resistor $R_4$ and capacitor $C_1$ combination acts as a filter to protect the transconductance amplifier $U_1$ from oscillation if the lead (B) or (C) should become disconnected. The feedback network for the transconductance amplifier (resistors $R_2$, $R_3$, and $R_5$) is conventional and functions to set and determine the amplifier's operating characteristics. Example of the types of circuits useable for the transconductance amplifier may be found on pages 225-228 of the above referenced work on "Operational Amplifiers" and also on page 239 of the Signetics, Incorporated, Data Manual, 1976, from Signetic, Incorporated.

FIG. 4 illustrates more details relating to the FIG. 2 block diagram of the current sensor and the synchronous current detector. Transformer $T_2$ is a step-up toroidal core current transformer (1:220 ratio) whose primary winding encircles the ground electrode. It is used to sense current changes in the mine safety ground electrode. These changes result in a voltage drop across parallel burden resistor $R_6$ between ground potential and the filter $F_1$. Filter $F_1$ is an active bandpass filter with a center frequency of approximately 11 Hz, Q=1, and a mid-band voltage gain of 10 such as that shown in FIG. 8.5 on pages 291 to 293 of the above referenced "Operational Amplifiers" work. Multiplier $M_1$ is a phase-sensitive detector circuit which receives input signals from the Filter 1 and the oscillator (signal A) and outputs a signal ($\pm 10$ v) to the Filter 2. This multiplier chip, used to synchronously detect the signal, could be a four quadrant analog multiplier such as MC 1595L integrated circuit from Motorola Semiconductor Products, Inc. of Phoenix, Ariz.

In FIG. 5 there is shown the preferred embodiment of the FIG. 2 voltage sensor and synchronous voltage detector. Filters $F_3$ and $F_4$ are essentially similar to the two filters $F_1$ and $F_2$, respectively of FIG. 4. Multiplier circuit $M_2$ is identical to multiplier $M_1$ of FIG. 4. Switch $S_2$ is a double-pole four throw rotary switch used to provide several ranges of instrument sensitivity and selectability in conjunction with the voltage divider networks. These networks are made up of resistors $R_7$, $R_8 \ldots R_{13}$, inclusive, and are designed to provide voltage attentuation while maintaining the proper source impedance to filter $F_3$. This source impedance in conjunction with resistor $R_{14}$ helps determine the frequency characteristics of filter $F_3$.

The two quadrant analog divider of FIG. 6 receives the two input signals D and G from their, respective, synchronous current and voltage detectors. This divider is, like the multipliers $M_1$ and $M_2$, made up of a MC 1595L integrated circuit. Amplifier $U_3$ acts as a voltage scaling amplifier such as those described in FIG. 16-1 on pages 537-539 of the book entitle "Integrated Electronics" by J. Millman and C. C. Halkias, McGraw-Hill Book Co., New York, N.Y. 1972. Resistors $R_{15}$ and $R_{16}$ determine the scale factor of the dividend input and resistors $R_{17}$, $R_{18}$, and $R_{19}$ determine the scale factor of the divisor input. Resistors $R_{20}$ and $R_{21}$ determine the voltage gain of the scale amplifiers.

The last figure, FIG. 7, discloses one type of power supply useable with this invention. Although not shown to avoid confusion, each of the other blocks of FIG. 2 would be hard wired connected to receive a $+15$ V, $-15$ V, and ground wire from this power supply. As previously pointed out, other types of power supplies such as battery operated ones may also be used. Beginning with the left hand side of the figure, power from an external alternating current source of 120 volts is inputted into the power transformer $T_3$. Single pole, single throw power switch $S_1$ and 1 ampere line fuse $F_5$ are used to, respectively, control and protect the power supply. Solid state full wave bridge rectifier with its 25 ampere RMS rating uses four diodes to convert the a.c. signal (120 volts, 60 Hz) to a 25 volt d.c. level. Regulators VR1 and VR2 are, respectively, positive ($+15$ V) and negative ($-15$ V) voltage regulators made from a LM 723 integrated circuit manufactured by the National Semiconductor Corporation of Santa Clara, Calif. as more fully explained on pages 1-68 to 1-72, FIGS. 4 and 3, of their Linear Data Book. Protective fuses $F_3$ and $F_4$ and capacitors $C_2$ and $C_3$ act to filter and protect the output from the bridge. Line fuses $F_3$ and $F_4$, rated at 1 ampere, are used to protect the transconductance of amplifier $U_1$ (see FIG. 3).

The output recorder which receives signal H displays the actual desired ground bed resistance. This may be any off-the-shelf recorder such as a meter, oscilloscope or chart recorder. One type of recorder which has been used with the preferred embodiment of our invention to continuously monitor fall-of-potential measurements was a strip-charter recorder.

Referring back to the most basic figures, FIG. 1 and FIG. 2, the explained important features needed to measure the resistance of the ground bed itself should be noted. The feature which allows paralled measurements of the current flow in the ground bed is the current transformer T₂ with its associated pick-up, etc. which reads the actual current flow through the earth. Thus, errors in readings previously made are eliminated by this actual reading.

Variations to the foregoing circuit elements are, of course, possible. For example, the current source may have an output current different from 11 Hz, other types of synchronous current and/or voltage detectors may be used, the recorder may be eliminated, and the voltage regulated power supply could be a self-contained battery operated power supply. None of these or any other possible changes should be used to limit the scope and extent of our invention which is to be measured only by the claims which follow.

We claim:

1. A system for measuring the electrical resistance of an earth electrode comprising in combination:
   a ground bed having an earth test electrode;
   a current probe inserted into the earth, said probe being spaced from said test electrode at least ten times the maximum dimension of the electrode under test;
   a voltage probe inserted into the earth, said probe being spaced from the test electrode approximately 62% of the distance to the current probe as measured along a straight line joining the test electrode and current probe;
   a substantially constant current a.c. source operable at a controlled frequency electrically connected to the electrode under test and the current probe, said source outputting a reference signal;
   a voltage level sensor connected to the electrode under test and the spaced voltage probe;
   a current sensing transformer operatively associated with the connection between the electrode under test and the constant current a.c. source;
   means for receiving signals from both said voltage level sensor and said transformer;
   means for synchronously rectifiying said received signals using the reference output signal from the constant current source; and
   divider means for continuously dividing the output signals from said means for synchronously rectifying and outputting a signal representative thereof.

2. The system of claim 1 also including means for receiving the output from the divider means and indicating in a fixed format the results thereof.

3. The system of claim 1 also including a power supply means for electrically powering: the current probe, the voltage probe, the constant current source, the voltage sensor, the transformer, the means for receiving signals from the voltage sensor and transformer, the means for synchronously rectifying, and the divider means.

4. The system of claim 3 wherein said power supply comprises a self contained battery operated power supply.

5. The system of claim 1 wherein the substantially constant current a.c. source has an oscillator which outputs a fixed frequency signal to a transconductance amplifier.

6. The system of claim 5 also including a second transformer electrically disposed and operable between the current source and the current probe.

7. The system of claim 1 wherein said means for receiving signals from both said voltage level sensor and said current sensing transformer and said means for synchronously rectifying said received signals comprises: a separate filter circuit for receiving signals from the voltage level sensor and from the current sensing transformers, each of said filters outputting a signal, and separate identical multiplier circuits for receiving each of said filtered output signals.

8. The system of claim 1 wherein said current sensing transformer is a torroidal core current transformer which encircles the ground bed electrode with its primary winding to pick up the actual current flow in the electrode received from the spaced current probe.

9. The system of claim 1 wherein voltage measurements of the ground bed are made with a high impedance voltage amplifier by measuring the voltage difference between the voltage probe and the changed voltage level sensed at the electrode.

* * * * *